US008995207B2

(12) United States Patent
Koob et al.

(10) Patent No.: US 8,995,207 B2
(45) Date of Patent: Mar. 31, 2015

(54) DATA STORAGE FOR VOLTAGE DOMAIN CROSSINGS

(75) Inventors: Christopher Edward Koob, Round Rock, TX (US); Jen Tsung Lin, San Diego, CA (US); Manojkumar Pyla, San Diego, CA (US); Martin Saint-Laurent, Austin, TX (US)

(73) Assignee: QUALCOMM Incorporated, San Diego, CA (US)

( * ) Notice: Subject to any disclaimer, the term of this patent is extended or adjusted under 35 U.S.C. 154(b) by 475 days.

(21) Appl. No.: 13/208,450

(22) Filed: Aug. 12, 2011

(65) Prior Publication Data

US 2013/0039133 A1 Feb. 14, 2013

(51) Int. Cl.
G11C 7/00 (2006.01)
G06F 5/06 (2006.01)
G11C 5/14 (2006.01)

(52) U.S. Cl.
CPC . *G06F 5/06* (2013.01); *G11C 5/145* (2013.01)
USPC .................. 365/189.11; 365/226; 365/233.11

(58) Field of Classification Search
None
See application file for complete search history.

(56) References Cited

U.S. PATENT DOCUMENTS

| | | | |
|---|---|---|---|
| 4,809,232 A | 2/1989 | Baumbaugh et al. | |
| 6,226,698 B1 * | 5/2001 | Yeung et al. | 710/57 |
| 7,093,144 B2 * | 8/2006 | Skroch | 713/300 |
| 7,254,677 B1 * | 8/2007 | Lowe et al. | 711/118 |
| 7,348,813 B1 * | 3/2008 | Nanda et al. | 327/141 |
| 7,437,582 B1 * | 10/2008 | Parlour | 713/320 |
| 7,733,127 B2 * | 6/2010 | Wingen | 326/80 |
| 8,139,426 B2 * | 3/2012 | Park et al. | 365/189.11 |
| 8,212,694 B2 * | 7/2012 | Lee | 341/101 |
| 8,451,147 B2 * | 5/2013 | Mazumdar et al. | 341/50 |
| 2007/0097771 A1 * | 5/2007 | Chu et al. | 365/221 |
| 2009/0189639 A1 | 7/2009 | Wingen | |
| 2009/0212842 A1 | 8/2009 | Illegems et al. | |
| 2010/0026364 A1 * | 2/2010 | Shankar et al. | 327/333 |
| 2010/0148839 A1 | 6/2010 | Chai et al. | |
| 2012/0314516 A1 * | 12/2012 | Campbell et al. | 365/189.11 |
| 2013/0182515 A1 * | 7/2013 | Lin et al. | 365/189.15 |

FOREIGN PATENT DOCUMENTS

JP H06149539 A 5/1994
WO 2010080172 A1 7/2010

OTHER PUBLICATIONS

International Search Report and Written Opinion—PCT/US2012/050641—ISA/EPO—Dec. 5, 2012.

(Continued)

*Primary Examiner* — Kretelia Graham
(74) *Attorney, Agent, or Firm* — Peter Michael Kamarchik; Nicholas J. Pauley; Joseph Agusta

(57) ABSTRACT

According to an embodiment, an apparatus includes a data storage device. Data to be stored in the data storage device is level shifted from a first voltage domain to a second voltage domain prior to being stored within the data storage device. The data storage device is powered by the second voltage domain. The apparatus further includes a circuit that is powered by the second voltage domain and that is responsive to data output by the data storage device.

34 Claims, 4 Drawing Sheets

(56) References Cited

OTHER PUBLICATIONS

Rydberg, III, Ray Robert. "Gasping for Harmony: Communication Between Arbitrary Clock Domains With Multiple Voltage Domains Using a Locally-Clocked, Linear Dual-Clock FIFO Scheme," Washington State University School of Electrical Engineering and Computer Science, http://www.eecs.wsu.edu/~rrydberg/Research/PhD_Dissertation.pdf, May 2009, 140 pages.

* cited by examiner

DATA STORAGE FOR VOLTAGE DOMAIN CROSSINGS

I. FIELD

The present disclosure is generally related to data storage and voltage domain crossings.

II. DESCRIPTION OF RELATED ART

Advances in technology have resulted in smaller and more powerful computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and internet protocol (IP) telephones, can communicate voice and data packets over wireless networks. Further, many such wireless telephones include other types of devices that are incorporated therein. For example, a wireless telephone can also include a digital still camera, a digital video camera, a digital recorder, and an audio file player. Also, such wireless telephones can process executable instructions, such as a web browser application, that can be used to access the Internet. As such, these wireless telephones can include significant computing capabilities.

Wireless telephones and other computing devices may include electronic devices supplied by different voltage supplies. Such electronic devices may include a voltage domain crossing that divides voltage domains associated with the different voltage supplies in order to reduce power consumption. To illustrate, the voltage domain crossing may divide a high voltage supply that is used to power delay-sensitive circuitry and a low voltage supply that is used to power other circuitry. A memory device that stores data, such as a buffer, may transmit data over the voltage domain crossing. For example, the memory device may accept data at a single input within a first voltage domain and generate multiple outputs of the data at a second voltage domain. Multiple level shifters may be used at the voltage domain crossing to shift signals from one of the voltage domains to another. Further, because sending the data signals over the voltage domain crossing using a single clock signal may cause clock skew (e.g., a phase difference between a clock signal at the first voltage domain and at the second voltage domain), different clocks may be associated with the different voltage domains. Therefore, to avoid clock skew, the level shifters may be positioned at an output of the memory and at the voltage domain crossing. However, positioning level shifters at the output of the memory device typically requires multiple level shifters (e.g., a level shifter corresponding to each of the multiple outputs of the memory).

III. SUMMARY

A data storage device, such as an asynchronous first-in first-out (FIFO) buffer, that accepts input data at a data input from a first voltage domain and outputs data at a second domain uses a level shifter at the data input. As a result, data to be stored at the data storage device may be level shifted from a level of a first voltage domain to a level of a second voltage domain by the level shifter prior to storing the data within the data storage device. Level shifting at the input of the data storage device instead of at the output of the data storage device enables use of a single level shifter at the data input instead of multiple level shifters corresponding to each of multiple data outputs per data input, thereby reducing a number of level shifters. Because reading and writing data are performed at the data storage device using different clock signals, a clock skew that can be caused by transmitting data from the first voltage domain to the second voltage domain using a single clock signal may be avoided.

In a particular embodiment, an apparatus includes a data storage device. Data to be stored in the data storage device is level shifted from a first voltage domain to a second voltage domain prior to being stored within the data storage device. The data storage device is powered by the second voltage domain. The apparatus further includes a circuit that is powered by the second voltage domain and that is responsive to data output by the data storage device.

In another particular embodiment, a method includes level shifting a data input signal to a data storage device from a first voltage level associated with a first voltage domain to a second voltage level associated with a second voltage domain. The data storage device is powered by the second voltage domain. An output of the data storage device is sent to a circuit powered by the second voltage domain. The data storage device is in a first clock domain and the circuit is in a second clock domain.

In another particular embodiment, an apparatus includes means for storing data. The apparatus further includes means for level shifting a data input signal to the means for storing data from a first voltage level associated with a first voltage domain to a second voltage level associated with a second voltage domain. The means for storing data is powered by the second voltage domain.

In another particular embodiment, a device includes a first voltage domain associated with a first voltage supply. The first voltage domain includes first circuitry powered by the first voltage supply. The device further includes a second voltage domain associated with a second voltage supply. The second voltage domain includes second circuitry powered by the second voltage supply. The device further includes a data storage device powered by the second voltage domain and a level shifter coupled to an input of the data storage device. The level shifter is configured to level shift data to be stored at the data storage device from the first voltage domain to the second domain prior to the data being stored within the data storage device.

Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

V. DETAILED DESCRIPTION

Figure 1:
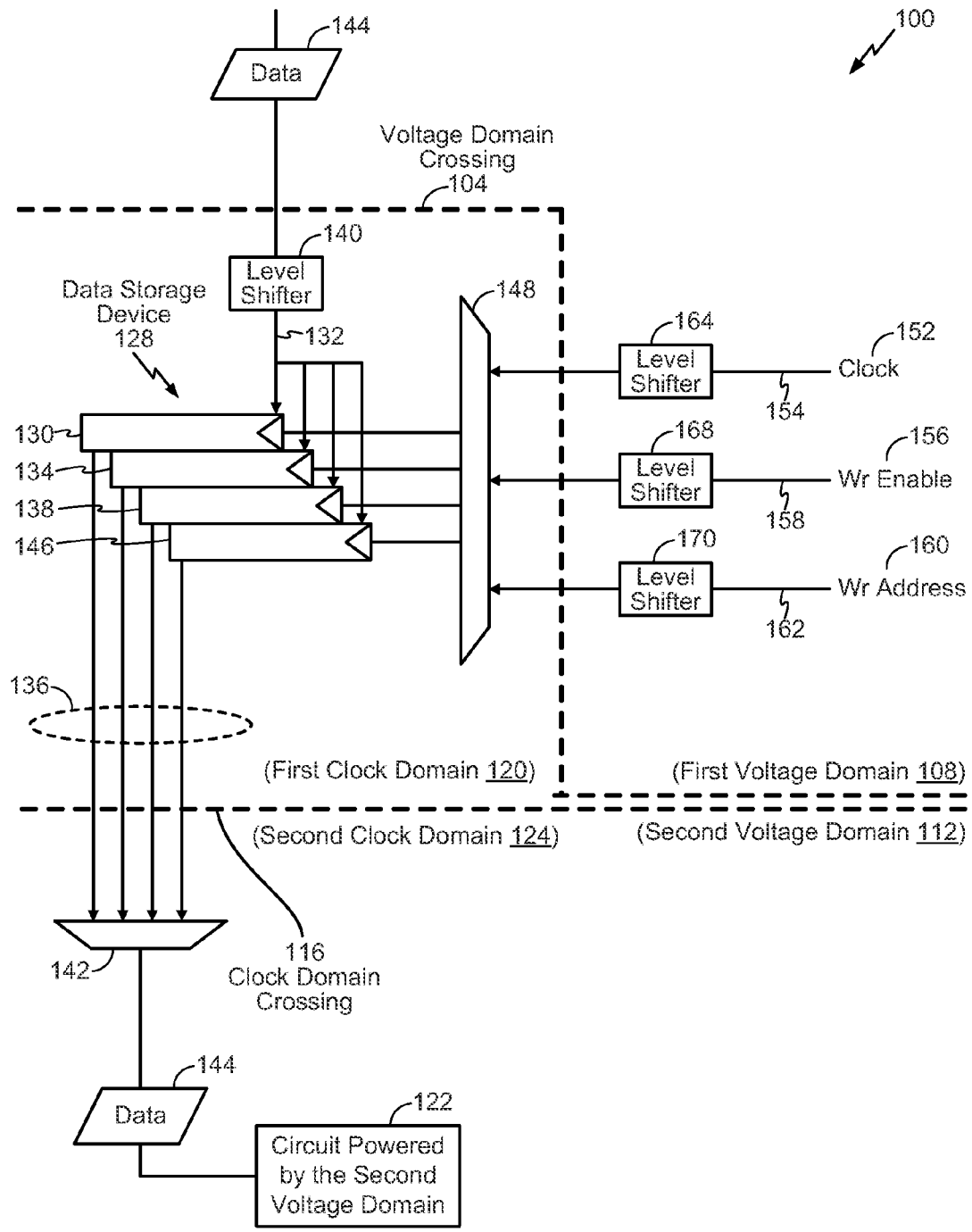
FIG. 1 is a diagram of a particular illustrative embodiment of a circuit to level shift data input signals to a data storage device.

Referring to FIG. 1, a particular illustrative embodiment of a circuit to level shift data input signals to a data storage device is depicted and generally designated 100. The circuit 100 includes a voltage domain crossing 104 that divides a first voltage domain 108 from a second voltage domain 112.

The circuit 100 further includes a clock domain crossing 116 that divides a first clock domain 120 from a second clock domain 124. The clock domain crossing 116 may be associated with a double data rate (DDR) transfer of data (e.g., data may be transferred between the first clock domain 120 and the second clock domain 124 on both the rising and falling edges of a clock cycle).

The circuit 100 may further include a data storage device 128. The data storage device 128 may include multiple storage locations (e.g., latching elements) configured to store data at the data storage device 128. For example, the multiple storage locations may include a first latching element 130, a second latching element 134, a third latching element 138, and a fourth latching element 146.

The data storage device 128 may include a data input 132 and multiple data outputs 136. The data storage device 128 may include multiple outputs per bit lane (i.e., multiple outputs 136 for each bit lane of the data input 132). To illustrate, if the data storage device 128 is one hundred bits wide and eight entries deep, the multiple data outputs 136 may include eight hundred data outputs. The multiple data outputs 136 traverse the clock domain crossing 116.

The multiple data outputs 136 may be coupled to output logic 142. The output logic 142 may include a multiplexor (MUX). The output logic 142 may be configured to provide an output (such as output data 144) that has a voltage level associated with the second voltage domain 112. For example, the output logic 142 may be configured to provide the output data 144 at a voltage level associated with the second voltage domain 112 to a circuit 122 that is powered by the second voltage domain 112. The circuit 122 may include circuitry that is responsive to data output by the data storage device 128.

A level shifter 140 may be coupled to the data storage device 128 and may provide data to the to the data storage device 128 via the data input 132. The level shifter 140 may be configured to level shift data to be stored in the data storage device 128 from a voltage level associated with the first voltage domain 108 to a voltage level associated with the second voltage domain 112. To illustrate, the first voltage domain 108 may utilize a first voltage level to represent a logic value, such as a "high" voltage level for a logic "one" bit. The second voltage domain may utilize a different voltage level to represent the logic value (e.g., a different voltage level to represent a logic "one" bit). Accordingly, it may be beneficial to use a level shifter, such as the level shifter 140, to level shift data sent between the first voltage domain 108 and the second voltage domain 112. Level shifters may be implemented in a variety of ways, such as logic gates formed by transistors.

The circuit 100 may include control logic 148. The control logic 148 may include a de-multiplexor (DMUX). The control logic 148 may be responsive to a clock signal 152, to a write enable signal 156, to a write address signal 160, or a combination thereof The clock signal 152 may be provided via a clock input 154 to the control logic 148. In addition, the write enable signal 156 may be provided by a write enable input 158 to the control logic 148, and the write address signal 160 may be provided by a write address input 162 to the control logic 148. As will be explained further with reference to FIG. 2, the control logic 148 may control read and write operations of the data storage device 128. For example, the control logic 148 may use a write pointer and a read pointer to determine addresses within the data storage device 128 for writing data to the data storage device 128 and for reading data from the data storage device 128. The control logic 148 may further be responsive to a determination that the data storage device 128 is "full" and that data should not be written to the data storage device 128 while the data storage device 128 is "full." Although FIG. 1 depicts that the clock input 154 is distinct from the write enable input 158, according to another embodiment, the clock signal 152 and the write enable signal 156 are provided to the control logic 148 via a single bus.

A second level shifter 164 may be coupled to receive the clock input 154, a third level shifter 168 may be coupled to receive the write enable input 158, and a fourth level shifter 170 may be coupled to receive the write address signal 160. The second level shifter 164 may be configured to level shift the clock signal 152 from a voltage level associated with the first voltage domain 108 to a voltage level associated with the second voltage domain 112. Similarly, the third level shifter 168 may be configured to level shift the write enable signal 156 from a voltage level associated with the first voltage domain 108 to a voltage level associated with the second voltage domain 112. The fourth level shifter 170 may be configured to level shift the write address signal 160 from a voltage level associated with the first voltage domain 108 to a voltage level associated with the second voltage domain 112.

In operation, the data storage device 128 may receive data 144 to be stored at the data storage device 128. Prior to storing the data 144, the level shifter 140 may level shift the data 144. For example, the level shifter 140 may level shift the data 144 from a voltage level associated with the first voltage domain 108 to a voltage level associated with the second voltage domain 112.

After level shifting the data 144 to the voltage level associated with the second voltage domain 112, the level shifter 140 may provide the data 144 to the data storage device 128 via the data input 132. The data storage device 128 may then store the data 144 and the stored data may be transmitted to the second voltage domain 112. According to a particular illustrative embodiment, the data storage device 128 includes an asynchronous first-in first-out (FIFO) buffer, where different clocks are used to write and read data. The asynchronous FIFO buffer may output data, such as the data 144, according to a first-in first-out basis.

After storing the data 144, the data storage device 128 may output the data 144 via the multiple data outputs 136. For example, the data storage device 128 may output the data 144 at a time determined by the control logic 148. The output logic 142 may further provide the data 144 to circuitry powered by the second voltage domain 112, such as the circuit 122 that is powered by the second voltage domain 112.

As will be appreciated, level shifting data at the data input 132 of the data storage device 128 instead of at the multiple data outputs 136 enables use of a single level shifter 140 at the data input 132 instead of multiple level shifters corresponding to each of multiple data outputs 136, thereby reducing a number of level shifters. For example, if each of the multiple outputs 136 generates a data bit for each bit lane of the data input 132, then area may be conserved by level shifting a data bit at the data input 132 instead of level shifting the data bit at each of the multiple outputs 136. Further, because reading and writing data are performed at the data storage device 128 using different clock signals, a clock skew that can be caused by transmitting data from the first voltage domain 108 to the second voltage domain 112 using a single clock signal may be avoided.

Figure 2:
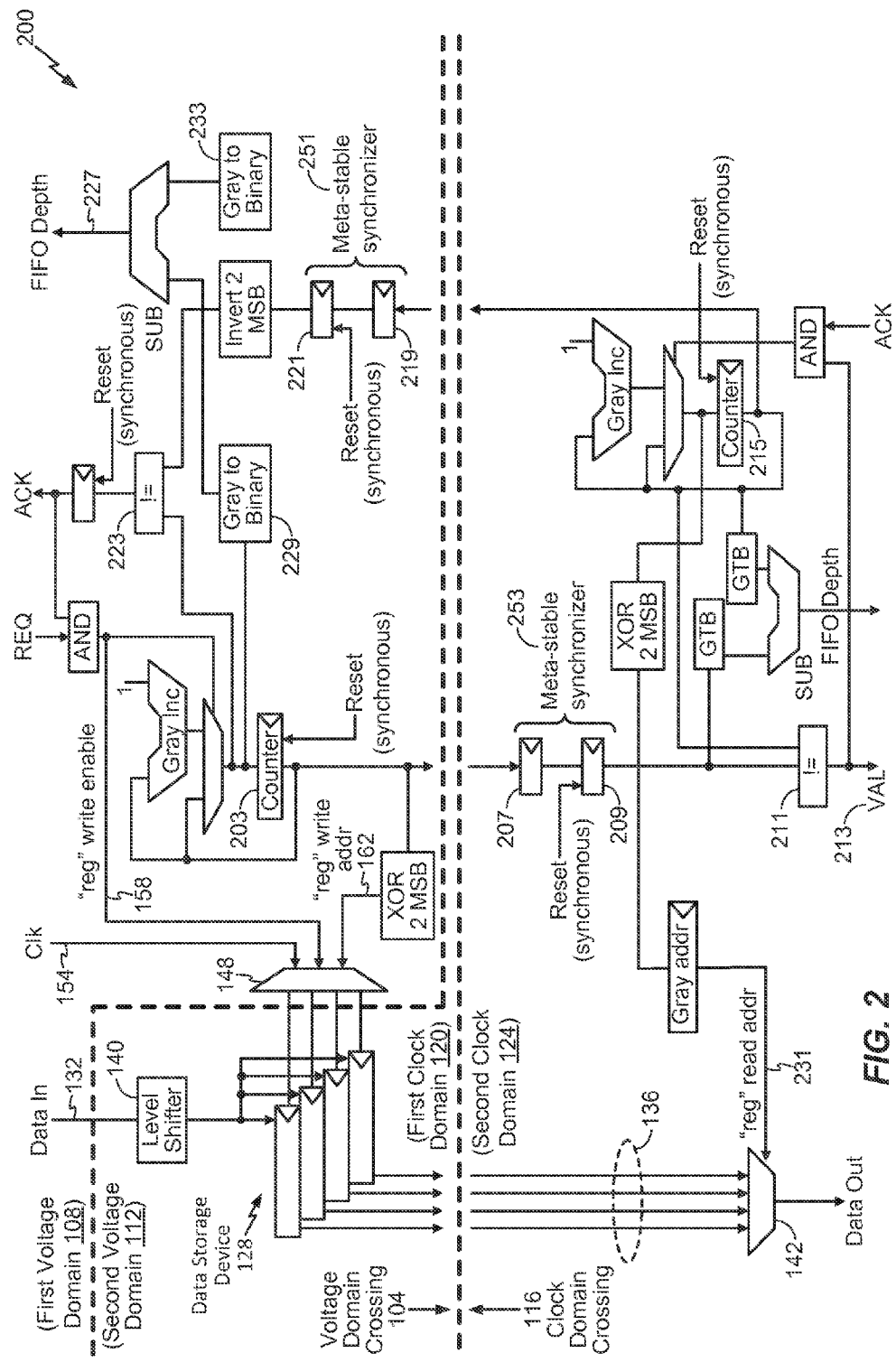
FIG. 2 is a diagram of a particular illustrative embodiment of a circuit to level shift data input signals to a data storage device.

Referring to FIG. 2, a particular illustrative embodiment of a circuit to level shift data input signals to a data storage device is depicted and generally designated 200. The circuit 200 may be described by referencing certain elements of the circuit 100 of FIG. 1. For example, the circuit 200 may be described in reference to the first voltage domain 108, the second voltage domain 112, the voltage domain crossing 104, the first clock domain 120, the second clock domain 124, the clock domain crossing 116, the data storage device 128, the data input 132, the multiple data outputs 136, the level shifter 140, the output logic 142, the control logic 148, the clock input 154, the write enable input 158, and the write address input 162 of FIG. 1, or a combination thereof The circuit 200 may include first circuitry associated with the first clock domain 120. For example, the first circuitry may include a write counter 203 that is responsive to write operations performed at the data storage device 128. The write counter 203 may be a counter that "counts" by changing one bit at a time, such as a Gray counter or a Johnson counter. The first circuitry may further include a first set of synchronizing latching elements, such as a first meta-stable synchronizer 251 formed by a first synchronizing latching element 219 and a second synchronizing latching element 221. The first circuitry may further include first equivalence check logic 223, a first Gray to binary (GTB) circuit 229, and a second GTB circuit 233.

The circuit 200 may further include second circuitry associated with the second clock domain 124. The second circuitry may include a read counter 215. The read counter 215 may be a counter that "counts" by changing one bit at a time, such as a Gray counter or a Johnson counter. The second circuitry may further include a second set of synchronizing latching elements, such as a second meta-stable synchronizer 253 formed by a third synchronizing latching element 207 and a fourth synchronizing latching element 209. The second circuitry may further include second equivalence check logic 211.

In operation, a data input signal may be received at the level shifter 140. The level shifter 140 may level shift the data input signal from a voltage level associated with the first voltage domain 108 to a voltage level associated with the second voltage domain 112. The level shifted data input signal may be written to the data storage device 128. In response to writing the level shifted data input signal, a write counter value stored at the write counter 203 may be incremented. For example, the write counter value may be incremented from "000" to "001" to indicate that data has been written to the data storage device 128 and is available to be read from the data storage device 128.

The write counter value may be sent from the first clock domain 120 to the second clock domain 124. For example, the write counter value may be sent to the third synchronizing latching element 207. The write counter value may be sent to the second clock domain 124 in response to new data being written to the data storage device 128 or at a predetermined interval (e.g., each clock cycle).

The second meta-stable synchronizer 253 may receive the write counter value and may synchronize the write counter value with a clock signal associated with the second clock domain 124. Synchronizing the write counter value may be performed during two cycles of the clock signal associated with the second clock domain 124.

The second equivalence check logic 211 may compare the write counter value to a read counter value stored at the read counter 215. If the write counter value is different than the read counter value, then a determination may be made that data is available to be read from the data storage device 128. For example, if the write counter value is "001" and the read counter value is "000," then a determination may be made that data has been written to the data storage device 128.

A valid signal 213 may be generated when the write counter value is different than the read counter value, indicating that data is available to be read from the data storage device 128. A read address signal 231 may be provided to the output logic 142 indicating an address of the data to be read, causing the data from the multiple data outputs 136 to be output by the output logic 142.

In response to outputting the data, the read counter 215 may be incremented to indicate that data has been read from the data storage device 128. For example, the read counter value of the read counter 215 may be incremented from "000" to "001." The read counter value may then be transmitted to the first clock domain 120. In general, the read counter value may be sent to the first clock domain 120 in response to data being read from the data storage device 128 or at a predetermined interval (e.g., each clock cycle).

The first meta-stable synchronizer 251 may receive the read counter value and may synchronize the read counter value according to a clock signal associated with the first clock domain 120. Synchronizing the read counter value may be performed during two cycles of the clock signal associated with the first clock domain 120.

The first equivalence check logic 223 may compare the read counter value to the write counter value to determine whether the data storage device 128 is "full" (e.g., whether a storage location of the data storage device 128 is available for writing data). For example, if the first equivalence check logic 223 determines that the read counter value and the write counter value do not point to the same storage location, then a determination may be made that the data storage device 128 is not full and that a storage location is available for storing data. If the first equivalence check logic 223 determines that the read counter value and the write counter value each point to the same storage location because the read pointer has "caught up" to the write pointer (e.g., all data stored at the data storage device 128 has been read), then a determination may be made that the data storage device 128 is empty. If the first equivalence check logic 223 determines that the read counter value and the write counter value each point to the same storage location because the write pointer has "caught up" to the read pointer (e.g., all storage locations at the data storage device 128 are storing data), then a determination may be made that the data storage device 128 is full.

A FIFO depth signal 227 may be generated based on the write counter value and the read counter value. The FIFO depth signal 227 may indicate a "depth" (e.g., available storage) of the data storage device 128. To generate the FIFO depth signal 227, the write counter value may be converted from a Gray code representation to a binary representation by the first GTB circuit 229. Similarly, the read counter value may be converted from a Gray code representation to a binary representation by the second GTB circuit 233. The outputs from the first GTB circuit 229 and from the second GTB circuit 233 are input to an arithmetic logic unit 230 that generates the FIFO depth signal 227.

As will be appreciated, level shifting data at the data input 132 of the data storage device 128 instead of at the multiple data outputs 136 enables use of a single level shifter 140 at the data input 132 instead of multiple level shifters corresponding to each of the multiple data outputs 136, reducing a number of level shifters. For example, if each of the multiple outputs 136 generates a data bit for each bit lane of the data input 132, then area may be conserved by level shifting a data bit at the data input 132 instead of level shifting the data bit at each of the multiple outputs 136. Further, because reading and writing data are performed at the data storage device 128 using different clock signals, a clock skew that can be caused by transmitting data from the first voltage domain 108 to the second voltage domain 112 using a single clock signal may be avoided.

The write counter 203 may receive a synchronous reset signal ("Reset (synchronous)"). The two most significant bits (MSB) of an output of the write counter 203 may be XORed to generate the write address input 162. The output of the write counter 203 may be input to a third synchronizing latching element 207. The output of the write counter 203 may also be input to a Gray code incrementer (Gray Inc) that also receives a logic "1" as an input. A multiplexer may receive an output of the Gray code incrementer and the output of the write counter 203 as input. An output of the multiplexer may be an input to the first GTB circuit 229 and to first equivalence check logic 223. The multiplexer may also receive an output of a first AND gate as a selection input. The first AND gate may receive a request (REQ) signal and an acknowledge (ACK) signal as inputs. The output of the first AND gate may be the write enable input 158. The ACK signal may be an output of a register that receives an output of first equivalence check logic 223 and the synchronous reset signal. The first equivalence check logic 223 may receive an output of a second synchronizing latching element 221 with two most significant bits (MSB) inverted. The second synchronizing latching element 221 may also receive the synchronous reset signal.

A fourth synchronizing latching element 209 may receive the synchronous reset signal and may provide an output to a third Gray to Binary (GTB) circuit. The third GTB circuit may provide an input to a second arithmetic logic unit (designated SUB) that receives another input from a fourth Gray to Binary (GTB) circuit. The fourth GTB circuit may receive an input from the read counter 215. The read counter 215 may receive the synchronous reset as an input. The output of read counter 215 may be an input to a Gray code incrementer (Gray Inc) that also receives a logic "1" as an input. A multiplexer may receive an output of the Gray code incrementer and the output of the read counter 215. The multiplexer may receive as a selector input, an output of a second AND gate that receives an ACK signal and an output of second equivalence check logic 211 as input. An output of the multiplexer may be stored in a Gray address register (Gray addr) after having two most significant bits (MSB) XORed, as shown.

Figure 3:
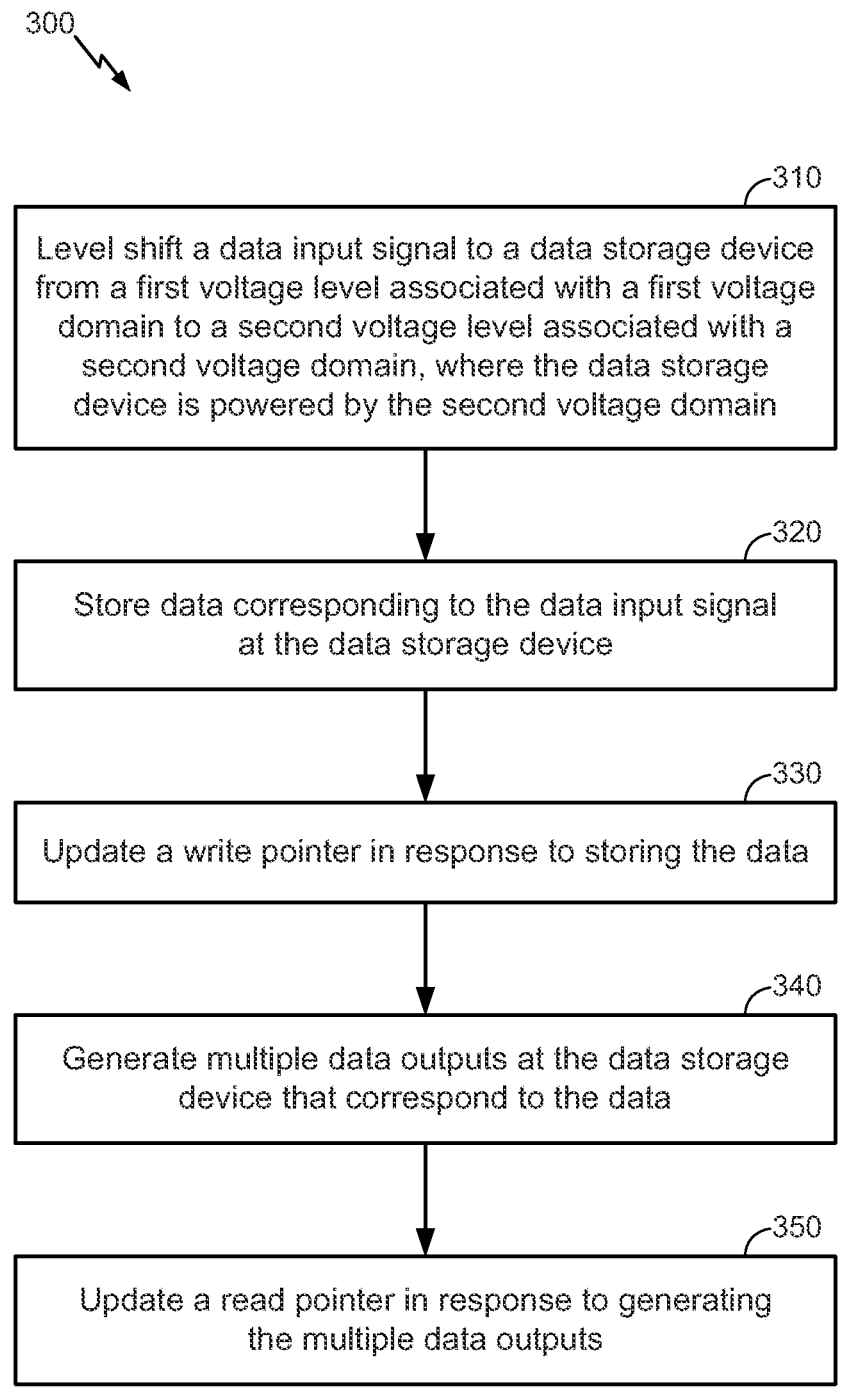
FIG. 3 is a flow chart of a particular illustrative embodiment of a method of level shifting a data input signal at an input of a data storage device.

Referring to FIG. 3, a flow diagram of a particular illustrative embodiment of a method of level shifting data input signals at an input of a data storage device is depicted and generally designated 300. The method 300 may be performed at a circuit that includes a voltage domain crossing. For example, the method 300 may be performed at the circuit 100 of FIG. 1, the circuit 200 of FIG. 2, or a combination thereof.

The method 300 includes level shifting a data input signal to a data storage device from a first voltage level associated with a first voltage domain to a second voltage level associated with a second voltage domain, where the data storage device is powered by the second voltage domain, at 310. In a particular illustrative embodiment, the data storage device is the data storage device 128 of FIGS. 1 and 2. In addition, the first voltage domain may be the first voltage domain 108 of FIGS. 1 and 2 and the second voltage domain may be the second voltage domain 112 of FIGS. 1 and 2.

The method 300 may further include storing data corresponding to the data input signal at the data storage device, at 320. In a particular illustrative embodiment, the data storage device includes an asynchronous first-in first-out (FIFO) buffer, and the data is stored and read according to a first-in first-out basis. Storing the data may be controlled by control logic, such as the control logic 148 of FIGS. 1 and 2.

The method 300 may further include updating a write pointer in response to storing the data, at 330. The write pointer may be the write counter value of the write counter 203 of FIG. 2.

The method 300 may further include generating multiple data outputs at the data storage device that correspond to the data, at 340. For example, data may be generated at the multiple data outputs 136 of FIGS. 1 and 2. Generating the multiple data outputs may be controlled at least in part by the output logic 142 of FIGS. 1 and 2.

The method 300 may further include updating a read pointer in response to generating the multiple data outputs, at 350. For example, the read pointer may be the read counter value of the read counter 215 of FIG. 2.

Figure 4:
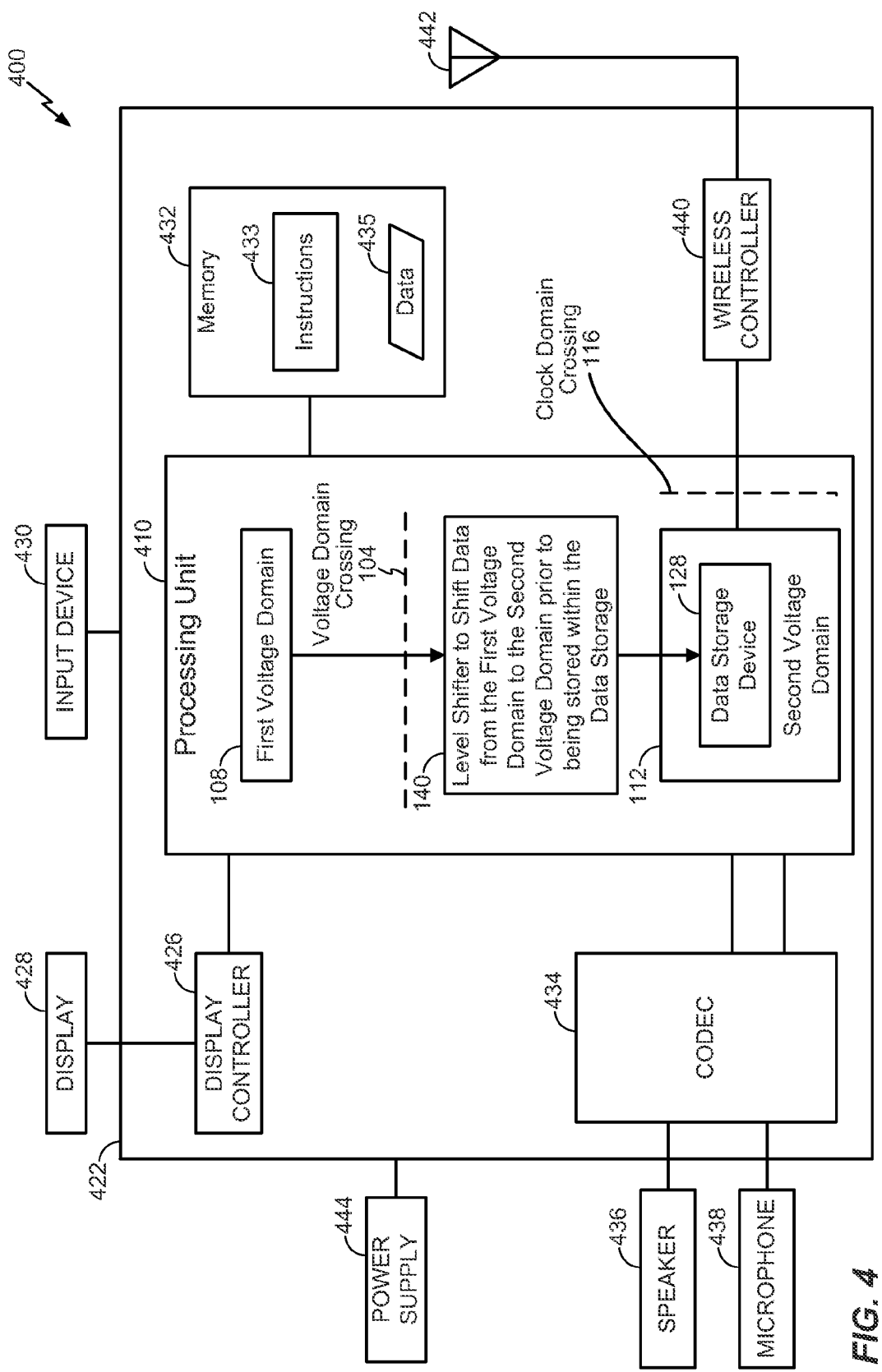
FIG. 4 is a diagram of an electronic device that includes a circuit to level shift data input signals to a data storage device.

Referring to FIG. 4, an electronic device that includes a circuit to level shift data input signals to a data storage device is depicted and generally designated 400. The electronic device 400 may include components of the circuit 100 of FIG. 1, the circuit 200 of FIG. 2, or a combination thereof. In addition, all or part of the method 300 described with reference FIG. 3 may be performed at the electronic device 400.

The electronic device 400 includes a processing unit, such as a processing unit 410. The processing unit 410 may include a voltage domain crossing 104 that divides a first voltage domain, such as a first voltage domain 108, and a second voltage domain, such as a second voltage domain 112. The processing unit 410 may further include a data storage device 128 powered by the second voltage domain. A level shifter 140 may shift data from the first voltage domain 108 to the second voltage domain 112 prior to being stored within the data storage device 128.

The processing unit 410 may be coupled to a memory 432. The memory 432 may store processor-executable instructions, such as instructions 433, executable by the processing unit 410. The memory 432 may further store data 435, such as results of executing one or more of the instructions 433 by the processing unit 410. The data 435 may be the data 144 of FIGS. 1 and 2. The memory 432 may be a non-transitory (e.g., tangible) storage medium. Examples of a non-transitory storage medium include random access memory (RAM), read-only memory (ROM), programmable read-only memory (PROM), erasable programmable read-only memory (EPROM), and electrically erasable programmable read-only memory (EEPROM).

A display controller 426 may be coupled to the processing unit 410 and to a display 428. A coder/decoder (CODEC) 434 may be coupled to the processing unit 410. A speaker 436 and a microphone 438 may be coupled to the CODEC 434. The electronic device 400 may further include a wireless controller 440 coupled to the processing unit 410 and to a wireless antenna 442.

In a particular embodiment, the processing unit 410, the display controller 426, the memory 432, the CODEC 434, and the wireless controller 440 are included in a system-in-package or system-on-chip device 422. In a particular embodiment, an input device 430 and a power supply 444 are coupled to the system-on-chip device 422. Moreover, in a particular embodiment, and as illustrated in FIG. 4, the display 428, the input device 430, the speaker 436, the microphone 438, the wireless antenna 442, and the power supply 444 are external to the system-on-chip device 422. However, each of the display 428, the input device 430, the speaker 436, the microphone 438, the wireless antenna 442, and the power supply 444 may be coupled to a component of the system-on-chip device 422, such as an interface or a controller.

The electronic device 400 may include first circuitry powered by the first voltage domain 108 and second circuitry powered by the second voltage domain 112. The processing unit 410 has a first voltage domain 108 and a second voltage domain 112. Certain circuits or components of the processing unit 410 may be in the first voltage domain 108 and other components or circuits of the processing unit 410 may be in the second voltage domain 112. The display controller 426 may be powered by the first voltage domain 108, and the wireless controller 440 may be powered by the second voltage domain 112. The wireless controller 440 may be responsive to data output by the data storage device 128 (e.g., the data 435). The processing unit 410 includes a clock domain crossing 116 between the data storage device 128 and an output to the wireless controller 440. While the first voltage domain 108 and the second voltage domain 112 have been illustrated in the processing unit 410, other components in the electronic device 400 may be in the first voltage domain 108, in the second voltage domain 112, or in a different voltage domain.

In conjunction with the disclosed circuits and methods of FIGS. 1-4, an apparatus includes means for storing data (e.g., the data storage device 128 of FIGS. 1, 2, and 4). The apparatus further includes means for level shifting (e.g., the level shifter 140 of FIGS. 1, 2, and 4) a data input signal to the means for storing data from a first voltage level associated with a first voltage domain (e.g., the first voltage domain 108 of FIGS. 1, 2, and 4) to a second voltage level associated with a second voltage domain (e.g., the second voltage domain 112 of FIGS. 1, 2, and 4). The means for storing data may be powered by the second voltage domain. Although FIG. 4 depicts the level shifter 140 included in the processing unit 410, it should be appreciated that the level shifter 140 may reside in any electronic component that utilizes a voltage domain crossing to separate multiple voltage domains.

Those of skill would further appreciate that the various illustrative logical blocks, configurations, modules, circuits, and steps described in connection with the embodiments disclosed herein may be implemented as electronic hardware, processor-executable instructions, or combinations of both. Various illustrative components, blocks, configurations, modules, circuits, and steps have been described above generally in terms of their functionality. Whether such functionality is implemented as hardware or as processor-executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or process described in connection with the embodiments disclosed herein may be embodied directly in hardware, in instructions executed by a processor, or in a combination of the two. Processor-executable instructions may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of storage medium known in the art. An exemplary non-transitory (e.g., tangible) storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. An apparatus comprising:
   a data storage device in a first clock domain, wherein data to be stored in the data storage device is level shifted from a first voltage domain to a second voltage domain. prior to being stored within the data storage device, and wherein the data storage device is powered by the second voltage domain;
   a circuit powered by the second voltage domain and in a second clock domain, the circuit responsive to output data, wherein the output data is output by the data storage device; and
   address circuitry powered by the first voltage domain, wherein the data storage device is responsive to an output of the address circuitry, and wherein the address circuitry includes a counter.

2. The apparatus of claim 1, wherein the data storage device has a single data input and multiple data outputs per bit lane, and wherein the address circuitry includes write address circuitry.

3. The apparatus of claim 2, further comprising a first level shifter coupled to the single data input, and wherein the first level shifter is configured to level shift the data to be stored from a first voltage level associated with the first voltage domain to a second voltage level associated with the second voltage domain.

4. The apparatus of claim 3, further comprising:
   control logic to control read and write operations at the data storage device, the control logic responsive to a clock signal, to a write enable signal, and to a write address signal;
   a second level shifter configured to level shift a clock input to generate the clock signal;
   a third level shifter configured to level shift a write enable input to generate the write enable signal; and
   a fourth level shifter configured to level shift a write address input to generate the write address signal.

5. The apparatus of claim 2, wherein the single data input and the multiple data outputs are separated by a clock domain crossing.

6. The apparatus of claim 1, wherein the data storage device includes an asynchronous first-in first-out (FIFO) buffer, wherein the counter stores a counter value, and wherein the counter value points to a next storage location of the asynchronous FIFO buffer.

7. The apparatus of claim 6, wherein the asynchronous FIFO buffer includes multiple latching elements.

8. The apparatus of claim 7, wherein the asynchronous FIFO buffer provides an output that has a voltage level associated with the second voltage domain.

9. A method comprising:
   level shifting a data input signal to a data storage device from a first voltage level associated with a first voltage domain to a second voltage level associated with a second voltage domain, wherein the data storage device is powered by the second voltage domain, wherein the data storage device is responsive to an output of address circuitry that is within the first voltage domain, and wherein the address circuitry includes a counter; and sending an output of the data storage device to a circuit powered by the second voltage domain, wherein the data storage device is in a first clock domain and the circuit is in a second clock domain.

10. The method of claim 9, further comprising storing data corresponding to the data input signal at the data storage device.

11. The method of claim 10, further comprising updating a write pointer of the address circuitry in response to storing the data.

12. The method of claim 11, further comprising generating multiple data outputs at the data storage device that correspond to the data.

13. The method of claim 12, wherein the data input signal is separated by a clock domain crossing from the multiple data outputs.

14. The method of claim 13, further comprising updating a read pointer in response to generating the multiple data outputs.

15. An apparatus comprising:
means for storing data, wherein the means for storing data is in a first clock domain is configured to receive a data input signal: and
means for level shifting the data input signal from a first voltage level associated with a first voltage domain to a second voltage level associated with a second voltage domain, wherein the means for storing data is powered by the second voltage domain, and wherein the means for storing data is responsive to an output of means for determining an address that is powered by the first voltage domain.

16. The apparatus of claim 15, wherein the means for level shifting includes a level shifter coupled to an input of the means for storing data.

17. The apparatus of claim 16, wherein an input of the means for level shifting is associated with the first voltage domain, and wherein an output of the means for level shifting is associated with the second voltage domain.

18. A device comprising:
a first voltage domain associated with a first voltage supply and including first circuitry powered by the first voltage supply;
a second voltage domain associated with a second voltage supply and including second circuitry powered by the second voltage supply;
a data storage device powered by the second voltage domain;
a level shifter coupled to an input of the data storage device and configured to level shift data to be stored at the data storage device from the first voltage domain to the second voltage domain prior to being stored within the data storage device; and
address circuitry powered by the first voltage domain, wherein the data storage device is responsive to an output of the address circuitry, and wherein the address circuitry includes a counter.

19. The device of claim 18, wherein a voltage domain crossing divides the first voltage domain and the second voltage domain.

20. The device of claim 19, wherein the input of the data storage device is associated with a first clock domain, and wherein an output of the data storage device is associated with a second clock domain, and wherein a clock domain crossing divides the first clock domain and the second clock domain.

21. The device of claim 18, wherein the data storage device includes an asynchronous first-in first-out (FIFO) buffer, and wherein the asynchronous FIFO buffer is responsive to a clock signal, to a write enable signal, and to a write address signal.

22. The device of claim 21, wherein the counter is a write counter, wherein the write counter stores a write counter value, wherein the write address signal points to a next storage location of the asynchronous FIFO buffer to be written to, and wherein the write address signal is generated based on the write counter value.

23. The device of claim 22, wherein the write counter is a Gray counter or a Johnson counter.

24. The device of claim 22, further comprising logic to receive the write counter value at the second voltage domain.

25. The device of claim 24, wherein the logic to receive the write counter value includes a pair of latching elements powered by the second voltage domain.

26. The device of claim 25, further comprising a read counter, powered by the second voltage domain, wherein the read counter is configured to store a read counter value that points to a next storage location of the asynchronous FIFO buffer to be read.

27. The device of claim 26, further comprising first equivalence check logic configured to compare the write counter value with the read counter value.

28. The device of claim 27, wherein the read counter is a Gray counter or a Johnson counter.

29. The device of claim 27, further comprising logic to receive the read counter value at the first voltage domain.

30. The device of claim 29, wherein the logic to receive the read counter value includes a pair of latching elements located at the first voltage domain.

31. The device of claim 30, further comprising second equivalence check logic configured to compare the write counter value with the read counter value.

32. The device of claim 29, wherein a FIFO depth signal is generated based on the write counter value and the read counter value.

33. The apparatus of claim 1, further comprising read address circuitry associated with the data storage device, wherein the read address circuitry is in the second clock domain and powered by the second voltage domain.

34. The apparatus of claim 33, further comprising:
a level shifter configured to level shift an input data signal to generate a level shifted input data signal,
wherein the address circuitry is configured to generate a write address for the data storage device, wherein the write address corresponds to a first memory location that the level shifted input data signal is written to during a write operation,
wherein the read address circuitry is configured to generate a read address for the data storage device, and wherein the read address corresponds to a second memory location that the level shifted input data signal is read from during a read operation.

* * * * *